(12) United States Patent
Chang et al.

(10) Patent No.: US 11,289,592 B2
(45) Date of Patent: Mar. 29, 2022

(54) STRUCTURE TO INCREASE BREAKDOWN VOLTAGE OF HIGH ELECTRON MOBILITY TRANSISTOR

(71) Applicant: NATIONAL SUN YAT-SEN UNIVERSITY, Kaohsiung (TW)

(72) Inventors: Ting-Chang Chang, Kaohsiung (TW); Yu-Ching Tsao, Kaohsiung (TW); Yu-Lin Tsai, Kaohsiung (TW); Po-Hsun Chen, Kaohsiung (TW); Yu-Shan Lin, Kaohsiung (TW); Wen-Chung Chen, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 16/906,109

(22) Filed: Jun. 19, 2020

(65) Prior Publication Data

US 2021/0367068 A1 Nov. 25, 2021

(30) Foreign Application Priority Data

May 25, 2020 (TW) .................................. 109117356

(51) Int. Cl.
*H01L 29/778* (2006.01)
(52) U.S. Cl.
CPC .................. *H01L 29/7786* (2013.01)
(58) Field of Classification Search
CPC .................................................. H01L 29/7786
See application file for complete search history.

(56) References Cited

U.S. PATENT DOCUMENTS

| | | | | |
|---|---|---|---|---|
| 2014/0264360 | A1* | 9/2014 | Huang | H01L 29/66462 257/76 |
| 2015/0279956 | A1* | 10/2015 | Ozaki | H01L 29/7786 257/330 |
| 2017/0117401 | A1* | 4/2017 | Shi | H01L 29/513 |
| 2019/0280112 | A1* | 9/2019 | Shimizu | H01L 21/3065 |
| 2020/0119176 | A1* | 4/2020 | Dasgupta | H01L 29/2003 |

* cited by examiner

*Primary Examiner* — Fernando L Toledo
*Assistant Examiner* — Valerie N Newton
(74) *Attorney, Agent, or Firm* — WPAT, PC

(57) ABSTRACT

A structure to increase the breakdown voltage of the high electron mobility transistor is provided to solve the problem of function loss under a high voltage state. The structure includes a substrate, a conducting layer located on the substrate, a gate insulating layer and an electric-field-dispersion layer. The upper portion of the conducting layer is an electron supply layer, and the lower portion of the conducting layer is an electron tunnel layer. The gate insulating layer is laminated on the electron supply layer. The electric-field-dispersion layer is laminated on the gate insulating layer. The dielectric constant of the electric-field-dispersion layer is smaller than that of the gate insulating layer. A gate electrode is located between the electric-field-dispersion layer and the gate insulating layer. A source and a drain electrodes are respectively electrically connected to the electric-field-dispersion layer, the gate insulating layer, the electron supply layer, and the electron tunnel layer.

6 Claims, 3 Drawing Sheets

STRUCTURE TO INCREASE BREAKDOWN VOLTAGE OF HIGH ELECTRON MOBILITY TRANSISTOR

CROSS REFERENCE TO RELATED APPLICATIONS

The application claims the benefit of Taiwan application serial No. 109117356, filed May 25, 2020, the entire contents of which are incorporated herein by reference.

BACKGROUND OF THE INVENTION

1. Field of the Invention

The present invention generally relates to an electronic device and, more particular, to a structure with high durability and safe use to increase the breakdown voltage of a high electron mobility transistor.

2. Description of the Related Art

The requirements for the specifications of electronic devices increase with the speed of research and development of technological products, such as electric vehicles, 5G communications and other industries, which require power devices that operate at high frequencies and high voltages and operate normally in high temperature environments. Therefore, for high frequency and high temperature wide bandgap power devices, such as high electron mobility transistors (HEMT), the resistance of the devices to high voltages must also be improved to avoid the power devices suffering from instantaneous high voltage break-through in the process of use, and the occurrence of dielectric break-down makes part of the insulator of the devices become a conductor, resulting in loss of functions of the collapsed power devices.

The above-mentioned conventional high electron mobility transistor has a breakdown voltage, which is the lowest critical voltage for the break-through of the transistor. When the voltage that the structure of the transistor withstands is greater than the breakdown voltage, the insulating layer of the transistor loses the electrical insulation ability and becomes a well-conducted state. The tiny electric current that originally passed through the transistor increased sharply, which would cause other electronic parts that are electrically connected to the transistor to be similarly affected by the high electric current, causing overloaded failure or even damaged. In addition, the general electronic circuit generates a surge at the moment of on/off switching, and the voltage of the surge is several times the normal working voltage of the circuit. In order to prevent the instantaneous voltage of the surge from exceeding the breakdown voltage and causing dielectric breakdown, the applicable working voltage of the transistor must be much lower than the breakdown voltage, or the transistor should be electrically connected to several protection devices to isolate the impact of the surge. Therefore, the conventional high electron mobility transistor with a low breakdown voltage has problems such as a small application range, increased installation cost and operational safety.

In view of this, the conventional high electron mobility transistor does have the need for improvement.

SUMMARY OF THE INVENTION

In order to solve the above-mentioned problems, the object of the present invention is to provide a structure to increase the breakdown voltage of a high electron mobility transistor, which can disperse the electric field strength of each layer of the transistor, thereby increasing the overall breakdown voltage.

The next object of the present invention is to provide a structure to increase the breakdown voltage of a high electron mobility transistor, which can be operated under high frequency and high temperature working conditions.

The directionality or its approximate terms, such as "upper", "lower", etc., described in the entire text of the present invention are mainly referring to the directions of the drawings, and the directionality or its approximate terms are only used to help explain and understand embodiments of the present invention, not to limit the present invention.

The use of the quantifier "a" or "one" in the devices and members described in the entire text of the present invention is only for the convenience of use and provides the usual meaning of the scope of the present invention. In the present invention, it should be interpreted as including one or at least one, and a single concept also includes plural cases unless it clearly explicitly indicates otherwise.

In an aspect, the structure to increase the breakdown voltage of the high electron mobility transistor of the present invention includes a substrate, a conducting layer located on the substrate, a gate insulating layer and an electric-field-dispersion layer. The upper portion of the conducting layer is an electron supply layer, and the lower portion of the conducting layer is an electron tunnel layer. The gate insulating layer is laminated on the electron supply layer, and the electric-field-dispersion layer is laminated on the gate insulating layer. The dielectric constant of the electric-field-dispersion layer is smaller than the dielectric constant of the gate insulating layer. A gate electrode is located between the electric-field-dispersion layer and the gate insulating layer. A source electrode and a drain electrode are respectively electrically connected to the electric-field-dispersion layer, the gate insulating layer, and the electron supply layer and the electron tunnel layer of the conducting layer.

Accordingly, the structure to increase the breakdown voltage of the high electron mobility transistor of the present invention can effectively disperse the electric field strength of each layer by using the electric-field-dispersion layer with the dielectric constant lower than that of the gate insulating layer, thereby increasing the breakdown voltage of the transistor device and further expanding the voltage range in which the high electron mobility transistor can maintain normal operation, and at the same time having the characteristics of high frequency operation and high temperature resistance. Further, there is no need to change the device manufacturing process, which can avoid additional manufacturing costs.

In an example, the upper surface of the substrate has a buffer layer, and the conducting layer is located on the buffer layer. In this way, the transistor power device of the conducting layer can be formed on the buffer layer, and thus has the effect of improving the crystal quality and electronic characteristics of the heterostructure of the transistor.

In an example, the material of the electron supply layer is aluminum gallium nitride, and the material of the electron tunnel layer is gallium nitride. In this way, a two-dimensional electron gas can be formed at the heterostructure interface of the electron supply layer and the electron tunnel layer to provide a tunnel for rapid movement of electrons, and thus has the effect of enhancing the high frequency operability of the device.

In an example, the dielectric constant of the material of the gate insulating layer is greater than 250, and the material of the gate insulating layer is strontium titanate. In this way, the gate insulating layer can have high dielectricity and thermal stability, and thus has the effect of preventing the loss of electrons, adjusting the electric field, and resisting high temperatures.

In an example, the dielectric constant of the material of the electric-field-dispersion layer is greater than 1 and smaller than 250, and the material of the electric-field-dispersion layer is carbon-doped silicon dioxide, fluorine-doped silicon dioxide, boron nitride, or Teflon. In this way, the dielectric constant of the electric-field-dispersion layer is relatively small and can withstand large electric field strength, and thus has the effect of reducing the electric field strength of the gate insulating layer and the electron supply layer.

In the examples, the high electron mobility transistor of the present invention further includes at least one protective layer. The at least one protective layer is laminated on the electric-field-dispersion layer. In this way, the at least one protective layer can protect the electrical functions of the underlying layers from the environmental impact, and thus has the effect of improving the reliability of the product.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 1:
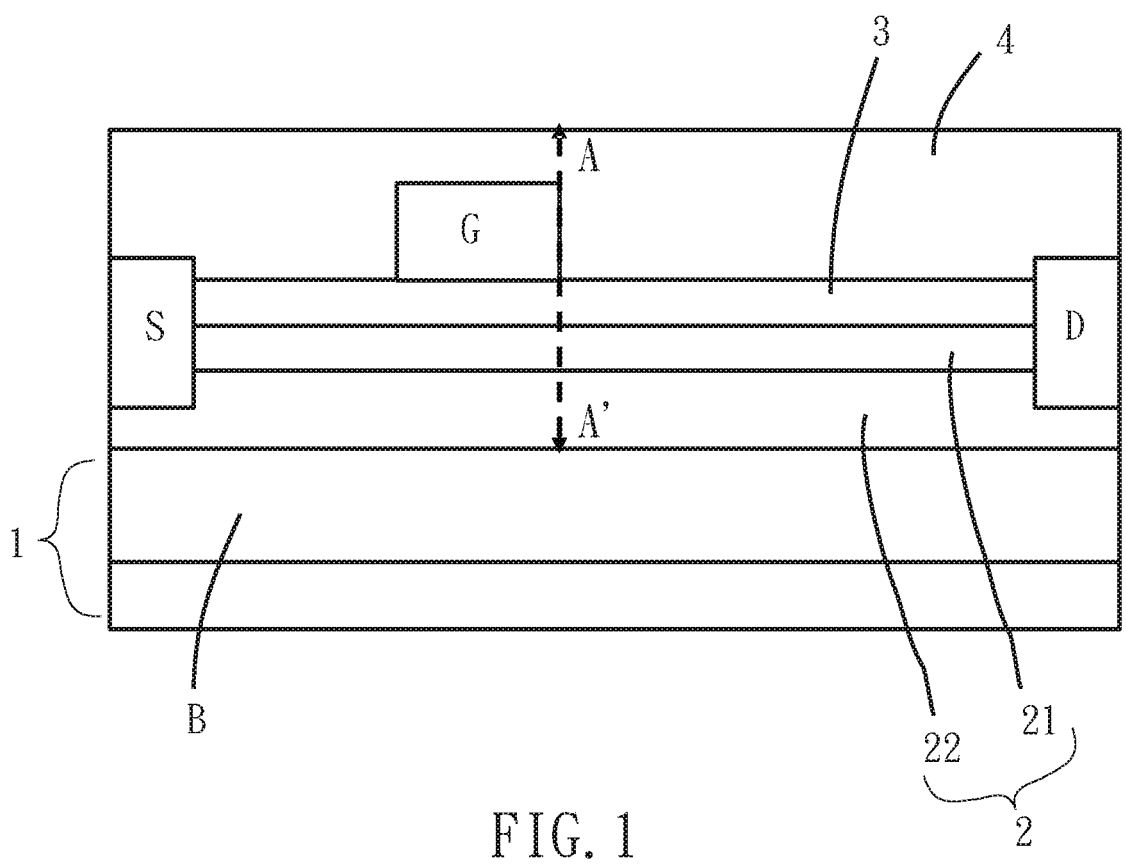
FIG. 1 is a laminated sectional view of a first embodiment of the present invention.

Please refer to FIG. 1, which shows a first embodiment of a structure to increase the breakdown voltage of a high electron mobility transistor of the present invention. The structure includes a substrate 1, a conducting layer 2, a gate insulating layer 3 and an electric-field-dispersion layer 4. The conducting layer 2 is located on the substrate 1, the gate insulating layer 3 and the electric-field-dispersion layer 4 are sequentially laminated on the conducting layer 2.

The substrate 1 is used to carry transistors. By forming transistor materials such as metals, insulators and semiconductors on the substrate 1, electron loss can be reduced and harmful electrical effects can be prevented. The material of the substrate 1 is preferably silicon, the upper surface of the substrate 1 may also have a buffer layer B, so that each transistor device can be formed on the buffer layer B to improve the crystal quality and electronic characteristics of the heterostructure of the high electron mobility transistor. In this embodiment, the materials of the buffer layer B are aluminum gallium nitride (AlGaN) and gallium nitride (GaN).

The upper portion of the conducting layer 2 is an electron supply layer 21, and the lower portion of the conducting layer 2 is an electron tunnel layer 22. The electron supply layer 21 and the electron tunnel layer 22 are made of materials with different bandgaps. A two-dimensional electron gas (2DEG) is formed at the heterostructure interface of the electron supply layer 21 and the electron tunnel layer 22 to provide a tunnel for rapid movement of electrons, so that the high electron mobility transistor has good high frequency characteristics. In this embodiment, the material of the electron supply layer 21 is aluminum gallium nitride, and the material of the electron tunnel layer 22 is gallium nitride.

The gate insulating layer 3 is laminated on the electron supply layer 21 of the conducting layer 2. The gate insulating layer 3 has an upper surface facing away from the conducting layer 3. The upper surface of the gate insulating layer 3 has a gate electrode G of the high electron mobility transistor. The gate electrode G applies an electric field to the conducting layer 2 through the gate insulating layer 3, and performs on/off switching and electrons flow control of the conducting layer 2 by changing the magnitude of the electric field. Therefore, the gate insulating layer 3 preferably has low conductivity and high dielectric constant, which can prevent the loss of electrons and adjust the working electric field. In this embodiment, the material of the gate insulating layer 3 is strontium titanate (SrTiO), and its dielectric constant is greater than 250.

The electric-field-dispersion layer 4 is laminated on the gate insulating layer 3, the gate electrode G is located between the electric-field-dispersion layer 4 and the gate insulating layer 3, and the dielectric constant of the material of the electric-field-dispersion layer 4 is smaller than the dielectric constant of the material of the gate insulating layer 3. According to Gauss's law, when the amount of electric charges from the source of the generated electric field is fixed, the ratio of the magnitude of electric field of each layer of the high electron mobility transistor is equal to the reciprocal ratio of the dielectric constant of each layer, that is, the layer with relatively small dielectric constant will share the larger electric field strength. Therefore, the electric-field-dispersion layer 4 withstands greater electric field strength than the gate insulating layer 3, which can achieve the effect of dispersing the electric field. In this embodiment, the dielectric constant of the material of the electric-field-dispersion layer 4 is greater than 1 and smaller than 250. The material of the electric-field-dispersion layer 4 can be carbon-doped silicon dioxide (SiO2: C), fluorine-doped silicon dioxide (SiO2: F), boron nitride (BN), or Teflon.

In addition, the high electron mobility transistor has a source electrode S and a drain electrode D, which are respectively electrically connected to the electric-field-dispersion layer 4, the gate insulating layer 3, and the electron supply layer 21 and the electron tunnel layer 22 of the conducting layer 2. In this way, the electrons between the source electrode S and the drain electrode D can efficiently move in the conducting layer 2, and the output electric current of the drain electrode D can also be adjusted through the magnitude of electric field between the gate electrode G and the substrate 1.

Figure 2:
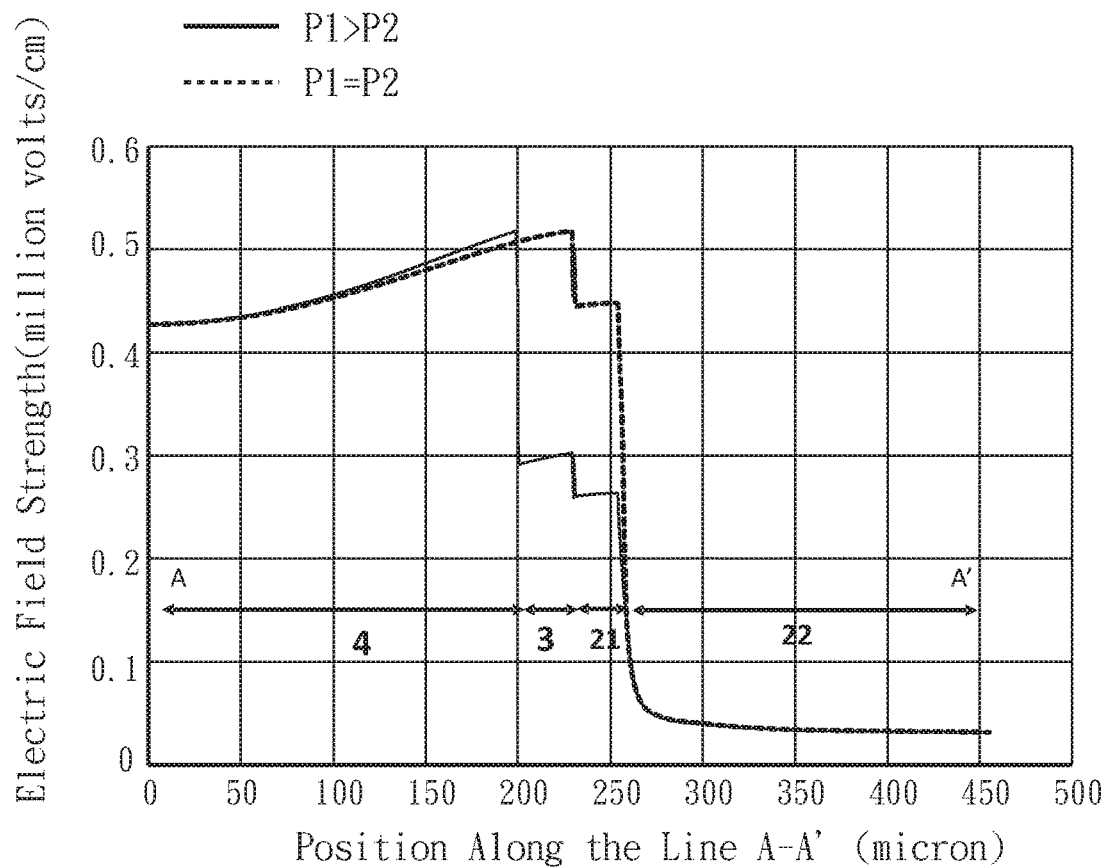
FIG. 2 is a layer-by-layer electric field strength distribution diagram of the first embodiment of the present invention.

Please refer to FIG. 2, which is a layer-by-layer electric field strength distribution diagram of the structure to increase the breakdown voltage of the high electron mobility transistor according to the first embodiment of the present invention. By marking the electric field value corresponding to each point position along the line A-A' in FIG. 1, it shows the electric field value change relationship from the electric-field-dispersion layer 4, the gate insulating layer 3, the electron supply layer 21 to the electron tunnel layer 22 in order. Among them, the material with a first dielectric constant P1 is selected for the gate insulating layer 3, and the material with a second dielectric constant P2 is selected for the electric-field-dispersion layer 4. When the first dielectric constant P1 is equal to the second dielectric constant P2, the electric field strength of the electric-field-dispersion layer 4 is 0.42~0.50 million volts/cm, the electric field strength of the gate insulating layer 3 is 0.50~0.52 million volts/cm, and the electric field strength of the electron supply layer 21 is 0.44 million volts/cm. When the first dielectric constant P1 is greater than the second dielectric constant P2, the electric field strength of the electric-field-dispersion layer 4 is 0.42~0.52 million volts/cm, the electric field strength of the gate insulating layer 3 is 0.30 million volts/cm, and the electric field strength of the electron supply layer 21 is 0.26 million volts/cm. By comparison, selecting a smaller second dielectric constant P2 can effectively reduce the electric field strengths of the gate insulating layer 3 and the electron supply layer 21, and thus can achieve the effect of dispersing the electric field.

Figure 3:
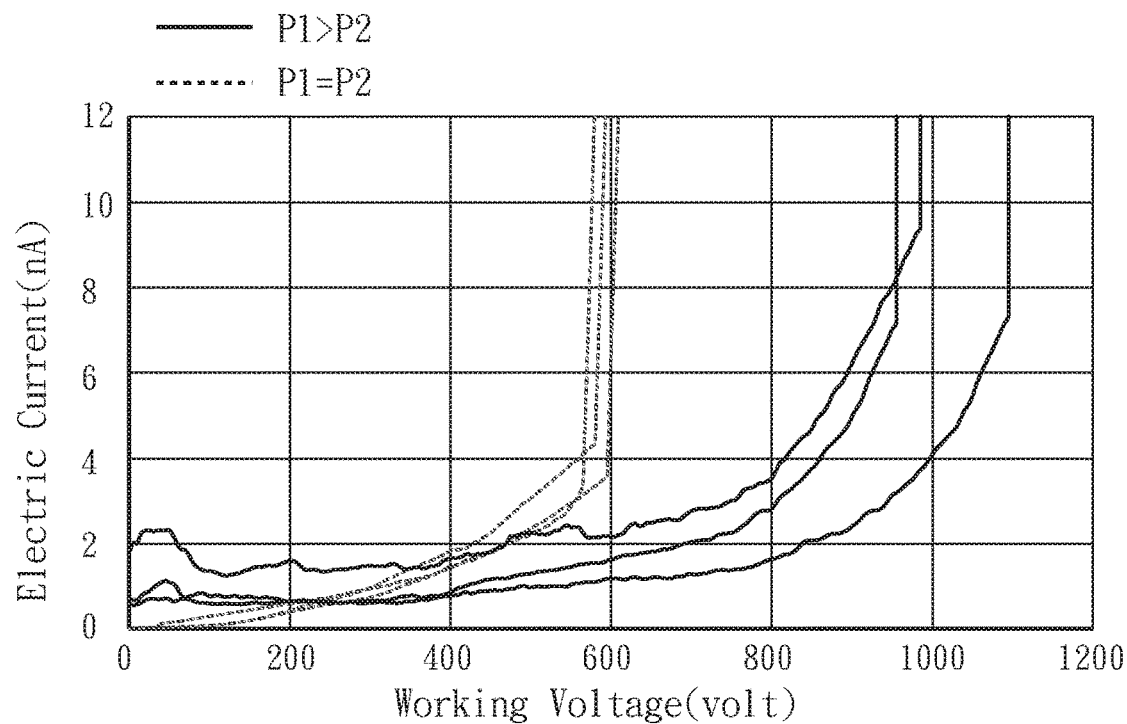
FIG. 3 is a breakdown voltage comparison diagram of the first embodiment of the present invention.

Please refer to FIG. 2 and FIG. 3, the increase of the working voltage applied to the high electron mobility transistor is to increase the electric field strength of the electric-field-dispersion layer 4, the gate insulating layer 3, the electron supply layer 21 and the electron tunnel layer 22 in equal proportions. When the increased electric field strength is sufficient to destroy the insulation characteristics of the high electron mobility transistor structure, the electric current passing through the high electron mobility transistor increases sharply, and the working voltage at this time is the breakdown voltage of the high electron mobility transistor. As shown in FIG. 3, when the first dielectric constant P1 of the high electron mobility transistor is equal to the second dielectric constant P2, the breakdown voltage is about 600 volts. When the first dielectric constant P1 of the high electron mobility transistor is greater than the second dielectric constant P2, since the electric-field-dispersion layer 4 has the effect of dispersing the electric field, the gate insulating layer 3 and the electron supply layer 21 need to be applied with a higher working voltage to achieve an electric field strength sufficient to cause the breakdown. The breakdown voltage at this time is increased to 1000 volts.

Figure 4:
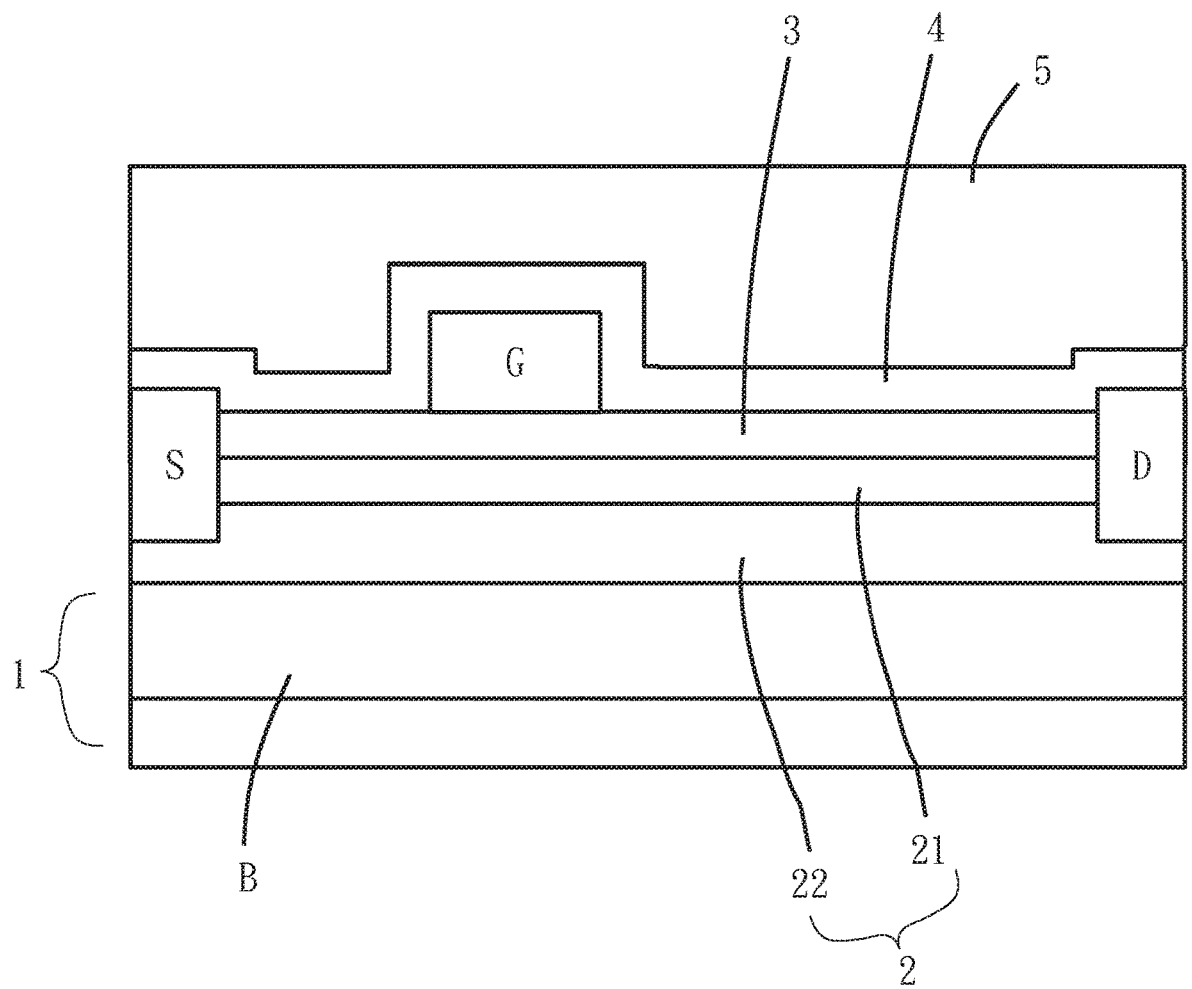
FIG. 4 is a laminated sectional view of a second embodiment of the present invention.

Please refer to FIG. 4, which shows a second embodiment of a structure to increase the breakdown voltage of a high electron mobility transistor of the present invention. The high electron mobility transistor may also have at least one protective layer 5 laminated on the electric-field-dispersion layer 4. The at least one protective layer 5 is used to protect the electrical functions of the underlying layers from environmental impact, and thus has the effect of improving the reliability of the product. The at least one protective layer 5 is not electrically connected to the gate electrode G, the source electrode S and the drain electrode D, and the material of the at least one protective layer 5 may have any dielectric constant.

In summary, the structure to increase the breakdown voltage of the high electron mobility transistor of the present invention can effectively disperse the electric field strength of each layer by using the electric-field-dispersion layer with the dielectric constant lower than that of the gate insulating layer, thereby increasing the breakdown voltage of the transistor device and further expanding the voltage range in which the high electron mobility transistor can maintain normal operation, and at the same time having the characteristics of high frequency operation and high temperature resistance. Further, there is no need to modify the device manufacturing process, which can avoid additional manufacturing costs.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A structure to increase breakdown voltage of high electron mobility transistor, comprising:
    a substrate;
    a conducting layer located on the substrate, with an upper portion of the conducting layer being an electron supply layer, and a lower portion of the conducting layer being an electron tunnel layer;
    a gate insulating layer laminated on the electron supply layer; and
    an electric-field-dispersion layer laminated on the gate insulating layer, wherein a dielectric constant of a material of the electric-field-dispersion layer is smaller than a dielectric constant of a material of the gate insulating layer, wherein a gate electrode is located between the electric-field-dispersion layer and the gate insulating layer, and wherein a source electrode and a drain electrode are respectively electrically connected to the electric-field-dispersion layer, the gate insulating layer, the electron supply layer, and the electron tunnel layer.

2. The structure to increase breakdown voltage of high electron mobility transistor as claimed in claim 1, wherein the substrate further includes a buffer layer laminated on an upper surface thereof, and the conducting layer is located on the buffer layer of the substrate.

3. The structure to increase breakdown voltage of high electron mobility transistor as claimed in claim 1, wherein a material of the electron supply layer is aluminum gallium nitride, and a material of the electron tunnel layer is gallium nitride.

4. The structure to increase breakdown voltage of high electron mobility transistor as claimed in claim 1, wherein the material of the gate insulating layer has the dielectric constant greater than 250, and the material of the gate insulating layer is strontium titanate.

5. The structure to increase breakdown voltage of high electron mobility transistor as claimed in claim 1, wherein the material of the electric-field-dispersion layer has the dielectric constant greater than 1 and smaller than 250, and the material of the electric-field-dispersion layer is carbon-doped silicon dioxide, fluorine-doped silicon dioxide, boron nitride, or Teflon.

6. The structure to increase breakdown voltage of high electron mobility transistor as claimed in claim 1, wherein the structure further comprises at least one protective layer, and the at least one protective layer is laminated on the electric-field-dispersion layer.

* * * * *